(12) United States Patent
Huang

(10) Patent No.: US 10,916,733 B2
(45) Date of Patent: Feb. 9, 2021

(54) DISPLAY DEVICE AND METHOD OF MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventor: Xiaowen Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/611,515

(22) PCT Filed: Sep. 20, 2019

(86) PCT No.: PCT/CN2019/106975
§ 371 (c)(1),
(2) Date: Nov. 7, 2019

(87) PCT Pub. No.: WO2020/244100
PCT Pub. Date: Dec. 10, 2020

(65) Prior Publication Data
US 2020/0388792 A1    Dec. 10, 2020

(30) Foreign Application Priority Data

Jun. 4, 2019    (CN) .......................... 2019 1 0480756

(51) Int. Cl.
H01L 51/52 (2006.01)
H01L 51/56 (2006.01)
H01L 27/32 (2006.01)

(52) U.S. Cl.
CPC ...... *H01L 51/5284* (2013.01); *H01L 27/3246* (2013.01); *H01L 51/5237* (2013.01); *H01L 51/56* (2013.01)

(58) Field of Classification Search
CPC . H01L 51/5284; H01L 51/5237; H01L 51/56; H01L 27/3246
USPC ......................................................... 257/40
See application file for complete search history.

(56) References Cited

U.S. PATENT DOCUMENTS

2017/0278900 A1*    9/2017    Yang ................. H01L 27/323

\* cited by examiner

*Primary Examiner* — Tong-Ho Kim
(74) *Attorney, Agent, or Firm* — Mark M. Friedman

(57) ABSTRACT

A display device and a method of manufacturing the same are disclosed. First, a black matrix layer is directly disposed on a second metal layer in such a manner that a distance between the black matrix layer and a light-emitting layer is shorten to avoid light loss, and thus transmittance is improved. Secondly, the black matrix layer can shield the second metal layer to avoid affecting the customer experience caused by high reflectivity of the second metal layer. Finally, a photoresist mask used in the etching process at the second metal layer to form a recess filed with color resist material in the prior art is replaced by the black matrix layer in such a manner that an exposure process and a lift-off process can be omitted while low reflectivity and high transmittance of the display device are ensured so as to reduce production costs.

9 Claims, 3 Drawing Sheets

DISPLAY DEVICE AND METHOD OF MANUFACTURING SAME

FIELD OF INVENTION

The present invention relates to the display technical field, and in particular, to a display device and a method of manufacturing the same.

BACKGROUND OF INVENTION

Organic light-emitting diodes (OLEDs) are also known as organic electroluminescence displays or organic electroluminescence semiconductors. The basic structure of OLEDs includes a thin and transparent indium tin oxide (ITO) anode with semiconductor properties, an organic light-emitting layer, and a metal cathode, wherein the organic light-emitting layer is sandwiched between the ITO anode and the metal cathode. The whole structure layer includes a hole transportation layer (HTL), an electroluminescence layer (EL), and an electron transportation layer (ETL). The holes of the anode and the electrons of the cathode are combined in a light emissive layer in case of appropriate voltage between the anode and the cathode, and excitons (electron-hole pairs) in an excited state are formed by recombination of electrons and holes by Coulomb force with a certain probability, wherein this excited state is unstable in a normal environment. The excitons in the excited state are formed and transfer energy to luminescent materials in such a manner that the luminescent materials transit from the excited state to a ground state. Accordingly, energy in the excited state generates photons by radiative relaxation process to release light energy, and three primary colors (RGB) of a red color, a green color and a blue color can be generated in order to form base colors such that light can be emitted.

OLED have self-luminous characteristics, unlike thin film transistor-liquid crystal displays which require backlights, and thus visibility and brightness of the OLEDs are high. Additionally, the OLEDs possess advantages of low voltage demand, high power saving efficiency, fast response, light weight, thin thickness, simple structure, low cost, wide viewing angles, almost infinite high contrast, low power consumption, extremely high reaction speed, etc., have become one of the most important display technologies nowadays, and are gradually replacing thin film transistor liquid crystal displays. Accordingly, the OLEDs are expected to become new mainstream of display technologies after liquid crystal displays.

Polarizers can effectively reduce reflectivity of panels under strong light, but cause nearly 58% of light exit loss. For the OLEDs, such light exit loss greatly increases burden on service life thereof. On the other hand, since thicknesses of the polarizers are larger and the material thereof are brittle, which are unfavorable to developments of dynamic bending products. In order to develop dynamic bending products based on the OLED display technologies, it is necessary to introduce new materials, new technologies and new processes to replace polarizers.

Use of a color filter instead of a polarizer (POL) is classified as a POL-less technique. A relative position relationship between a direct on-cell touch (DOT) and the POL-less needs to be taken into account in the traditional combination of the DOT and the POL-less process. Under a circumstance of the DOT being placed above the POL-less, although transmittance of the POL is improved, reflectivity of a display is higher in the sun due to the high reflectivity of a metal mesh line of the DOT to ambient light, and even shadow of the metal mesh line would be seen, which will affect a user experience. However, under a circumstance of the DOT being disposed below the POL-less, although the metal mesh line of the DOT can be shielded by a black matrix in the POL-less, a large part of light would be absorbed or blocked by the black matrix since the POL-less film is separated from an electroluminescence film layer by a thin film encapsulation and the DOT resulting in a large distance, which seriously affects transmittance of the display. It can be seen that traditional circular polarizers cannot be replaced to achieve a goal of flexible displays if the POL-less and the DOT technologies cannot be well combined. Therefore, it is necessary to seek a new type of display device to solve the above problems.

SUMMARY OF INVENTION

An object of the present invention is to provide a display device and a method of manufacturing the same, which can solve the problems in the combination of the DOT and the POL-less in the prior art, and an exposure process and a lift-off process can be omitted while low reflectivity and high transmittance of the display device are ensured so as to greatly reduce production costs.

In order to solve the aforementioned problem, an embodiment of the present invention provides a display device, comprising an array substrate layer, a light-emitting layer, an encapsulation layer, a buffer layer, a first metal layer, an insulating layer, a second metal layer, and a black matrix layer. The light-emitting layer is disposed on the array substrate layer; the encapsulation layer is disposed on the light-emitting layer; the buffer layer is disposed on the encapsulation layer; the first metal layer is disposed on the buffer layer; the insulating layer covers the first metal layer; and the second metal layer is disposed on the insulating layer. The second metal layer is connected to the first metal layer through a via and the black matrix layer covers the second metal layer. An area of the black matrix layer corresponding to the light-emitting layer is recessed downward to form a recess, and the recess is filled with color resist material.

Further, the area is recessed from a surface of a side of the black matrix layer facing away from the array substrate layer to a surface of a side of the second metal layer facing the array substrate layer to form the recess.

Further, the area is recessed from a surface of a side of the black matrix layer facing away from the array substrate layer into the insulating layer to form the recess.

Further, the area is recessed from a surface of a side of the black matrix layer facing away from the array substrate layer into the buffer layer to form the recess.

Further, the display device further comprises a plurality of anodes, a pixel defining layer and a cathode. The plurality of anodes are spaced apart from each other on the array substrate layer, wherein the light emitting layer is disposed on the plurality of anodes. The pixel defining layer is disposed on the array substrate layer between two of the anodes adjacent to each other. The cathode is disposed on the light-emitting layer.

Further, the display device further comprises a planar layer disposed on the black matrix layer.

Another embodiment of the present invention further provides a method of manufacturing the display device according to the present invention, which comprises steps of:

a step S1 of manufacturing the array substrate layer;

a step S2 of manufacturing the light-emitting layer on the array substrate layer;

a step S3 of manufacturing the encapsulation layer on the light-emitting layer;

a step S4 of manufacturing the buffer layer on the encapsulation layer;

a step S5 of manufacturing the first metal layer on the buffer layer;

a step S6 of manufacturing the insulating layer to cover the first metal layer;

a step S7 of manufacturing the second metal layer on the insulating layer, wherein the second metal layer is connected to the first metal layer through the via;

a step S8 of manufacturing the black matrix layer on the second metal layer, and recessing the position of the black matrix layer corresponding to the light-emitting layer downward to form the recess; and a step S9 of filling the color resist material with the recess.

Further, in the step S8, the recess is obtained by etching the black matrix layer and the second metal layer.

Further, in the step S8, the recess is obtained by etching the black matrix layer, the second metal layer, and the insulating layer.

Further, in the step S8, the recess is obtained by etching the black matrix layer, the second metal layer, the insulating layer, and the buffer layer.

The invention relates to a display device and a method of manufacturing the same. First, a black matrix layer is directly disposed on a second metal layer in such a manner that a distance between the black matrix layer and a light-emitting layer is shorten to avoid light loss, and thus transmittance is improved. Secondly, the black matrix layer can shield the second metal layer to avoid affecting the customer experience caused by high reflectivity of the second metal layer. Finally, a photoresist mask used in the etching process at the second metal layer to form a recess filed with color resist material in the prior art is replaced by the black matrix layer in such a manner that an exposure process and a lift-off process can be omitted while low reflectivity and high transmittance of the display device are ensured so as to reduce production costs.

BRIEF DESCRIPTION OF THE DRAWINGS

In order to illustrate technical solutions of the present invention more clearly, the following section briefly introduces drawings used to describe the embodiments. Obviously, the drawings in the following descriptions are merely some embodiments of the present invention. The ordinary person in the related art can acquire other drawings according to these drawings without offering creative efforts.

Figure 1:
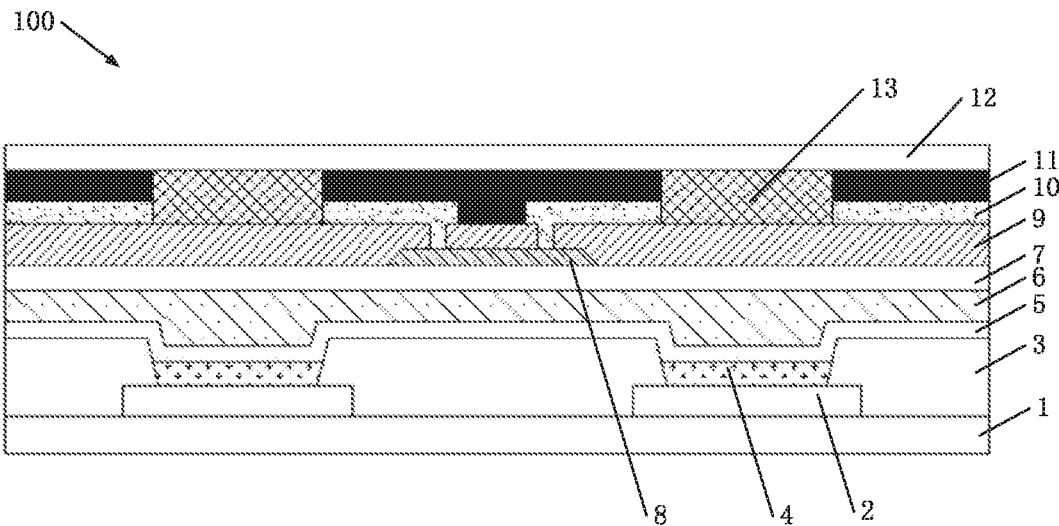
FIG. 1 is a schematic view showing the structure of the display device according to a first embodiment of the present invention.

Reference numerals in the drawings are shown as follows:

100: display device
1: array substrate layer;
2: anode
3: pixel defining layer
4: light-emitting layer
5: cathode
6: encapsulation layer
7: buffer layer
8: first metal layer
9: insulating layer
10: second metal layer
11: black matrix layer
12: planar layer
13: recess

DETAILED DESCRIPTION OF EMBODIMENTS

For fully introducing the technical contents of the present invention to those skilled in the art, the present disclosure will be explained in detail with reference to the embodiments and the accompanying drawings to prove that the present invention can be implemented by way of examples, so that the technical contents of the present invention will become more apparent, and those skilled in the art will understand how to implement the present invention. The present invention may, however, be implemented in many different forms of embodiments, and the scope of the present invention is not limited to the embodiments described herein. The following description of the embodiments is not intended to limit the scope of the present invention.

Directional terms described by the present invention, such as "upper", "lower", "front", "back", "left", "right", "inner", "outer", "side", etc., are only directions by referring to the accompanying drawings, and thus the used directional terms are used to describe and understand the present invention, but the present invention is not limited thereto.

In the drawings, structure-like elements are labeled with like reference numerals. Like reference numerals designate like elements throughout the specification. In addition, the size and thickness of each component shown in the drawings are arbitrarily shown for understanding and ease of description, but the present invention is not limited thereto.

When a component is described as "on" another component, it means that the component would be placed directly on another component, or there would also be an intermediate component placed between the component and another component. When a component is described as "assembled to" or "connected to" another component, both can be understood as directly "assembled" or "connected", or the component is "assembled to" or "connected to" through an intermediate component.

Embodiment 1

As shown in FIG. 1, a display device 100 comprises an array substrate layer 1, a plurality anodes 2, a pixel defining layer 3, a light-emitting layer 4, a cathode 5, an encapsulation layer 6, a buffer layer 7, a first metal layer 8, an insulating layer 9, a second metal layer 10, a black matrix layer 11, and a planar layer 12.

As shown in FIG. 1, a plurality of anodes 2 are spaced apart from each other on the array substrate layer 1. The pixel defining layer 3 is disposed on the array substrate layer 1 between two of the anodes 2 adjacent to each other. The light emitting layer 4 is disposed on the plurality of anodes 2. The cathode 5 is disposed on the light-emitting layer 4. The encapsulation layer 6 is disposed on the cathode 5.

As shown in FIG. 1, the buffer layer 7 is disposed on the encapsulation layer 6. The material of the buffer layer 7 may be selected from SiNx, and the buffer layer 7 thus composed has a good transmittance, so that high transmittance of the display device 100 can be ensured.

As shown in FIG. 1, the first metal layer 8 is disposed on the buffer layer. The insulating layer 9 covers the first metal layer 8. The second metal layer 10 is disposed on the insulating layer 9. The second metal layer 10 is connected to the first metal layer 8 through a via. The first metal layer 8 provides an excitation signal and the second metal layer 10 receives the signal. When the display device 100 is touched by a finger, a capacitance is generated between the first metal layer 8 and the second metal layer 10, so that the first metal layer 8 contacts with the second metal layer 10 causing a decrease of capacitive coupling, and thereby the touch position of the finger can be determined.

As shown in FIG. 1, the black matrix layer 11 covers the second metal layer 10. First, a black matrix layer 11 is directly disposed on a second metal layer 10 in such a manner that a distance between the black matrix layer 11 and the light-emitting layer 4 is shorten to avoid light loss, and thus transmittance is improved. Secondly, the black matrix layer 11 can shield the second metal layer 10 to avoid affecting the customer experience caused by high reflectivity of the second metal layer 10.

As shown in FIG. 1, an area of the black matrix layer 11 corresponding to the light-emitting layer 4 is recessed downward to form a recess 13, and the recess 13 is filled with color resist material. The area is recessed from a surface of a side of the black matrix layer 11 facing away from the array substrate layer 1 to an area between a surface of a side of the second metal layer 10 facing the array substrate layer 1 and a surface of a side of the buffer layer 7 facing the array substrate layer 1 to form the recess 13 depending on actual needs. In the present embodiment, the area is recessed from a surface of a side of the black matrix layer 11 facing away from the array substrate layer 1 to a surface of a side of the second metal layer 10 facing the array substrate layer 1 to form the recess 13. The color resist material filled in the recess 13 is mainly to enable the light emitted by the light-emitting layer 4 to be smoothly emitted. Moreover, the black matrix layer 11 is directly disposed on the second metal layer 10 as the photoresist mask used in the etching process at the second metal layer 10 to form the recess 13 filled with color resist material. Thus, an exposure process and a lift-off process can be omitted while low reflectivity and high transmittance of the display device are ensured so as to reduce production costs As shown in FIG. 1, the planar layer 12 is disposed on the black matrix layer 11. The constituent material of the planar layer 12 may be selected from SiNx or SiO2, and the planar layer 12 thus composed has a good transmittance.

Embodiment 2

Figure 2:
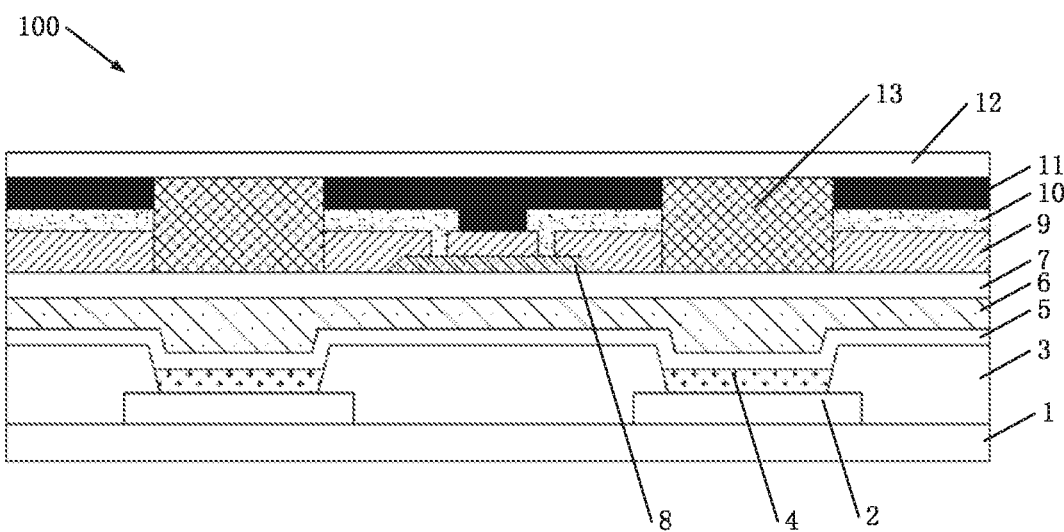
FIG. 2 is a schematic view showing the structure of the display device according to a second embodiment of the present invention.

As shown in FIG. 2, the difference between a display device in the present embodiment and the display device 100 in the embodiment 1 is that the area is recessed from a surface of a side of the black matrix layer 11 facing away from the array substrate layer 1 into the insulating layer 9 to form the recess 13. First, the black matrix layer 11 is directly disposed on a second metal layer 10 in such a manner that a distance between the black matrix layer 11 and the light-emitting layer 4 is shorten to avoid light loss, and thus transmittance is improved. Secondly, the black matrix layer 11 can shield the second metal layer 10 to avoid affecting the customer experience caused by high reflectivity of the second metal layer 11. The black matrix layer 11 is directly disposed on the second metal layer 10 as the photoresist mask used in the etching process at the second metal layer 10 to form the recess 13 filled with color resist material. Thus, an exposure process and a lift-off process can be omitted while low reflectivity and high transmittance of the display device are ensured so as to reduce production costs Embodiment 3

Figure 3:
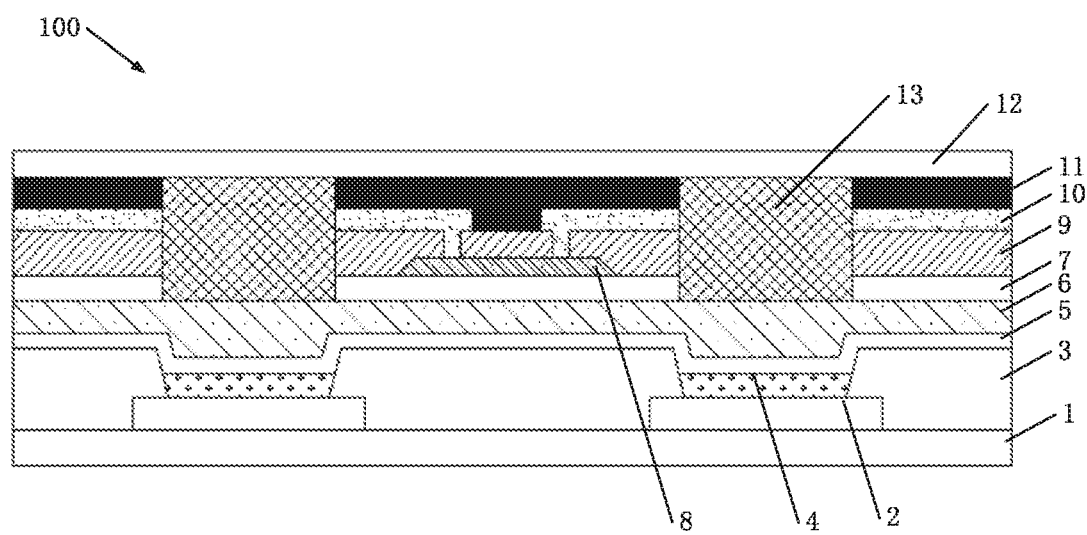
FIG. 3 is a schematic view showing the structure of the display device according to a third embodiment of the present invention.

As shown in FIG. 3, the difference between a display device the present embodiment and the display device 100 in the embodiment 1 is that the area is recessed from a surface of a side of the black matrix layer 11 facing away from the array substrate layer 1 into the buffer layer 7 to form the recess 13. First, the black matrix layer 11 is directly disposed on a second metal layer 10 in such a manner that a distance between the black matrix layer 11 and the light-emitting layer 4 is shorten to avoid light loss, and thus transmittance is improved. Secondly, the black matrix layer 11 can shield the second metal layer 10 to avoid affecting the customer experience caused by high reflectivity of the second metal layer 11. The black matrix layer 11 is directly disposed on the second metal layer 10 as the photoresist mask used in the etching process at the second metal layer 10 to form the recess 13 filled with color resist material. Thus, an exposure process and a lift-off process can be omitted while low reflectivity and high transmittance of the display device are ensured so as to reduce production costs.

Figure 4:
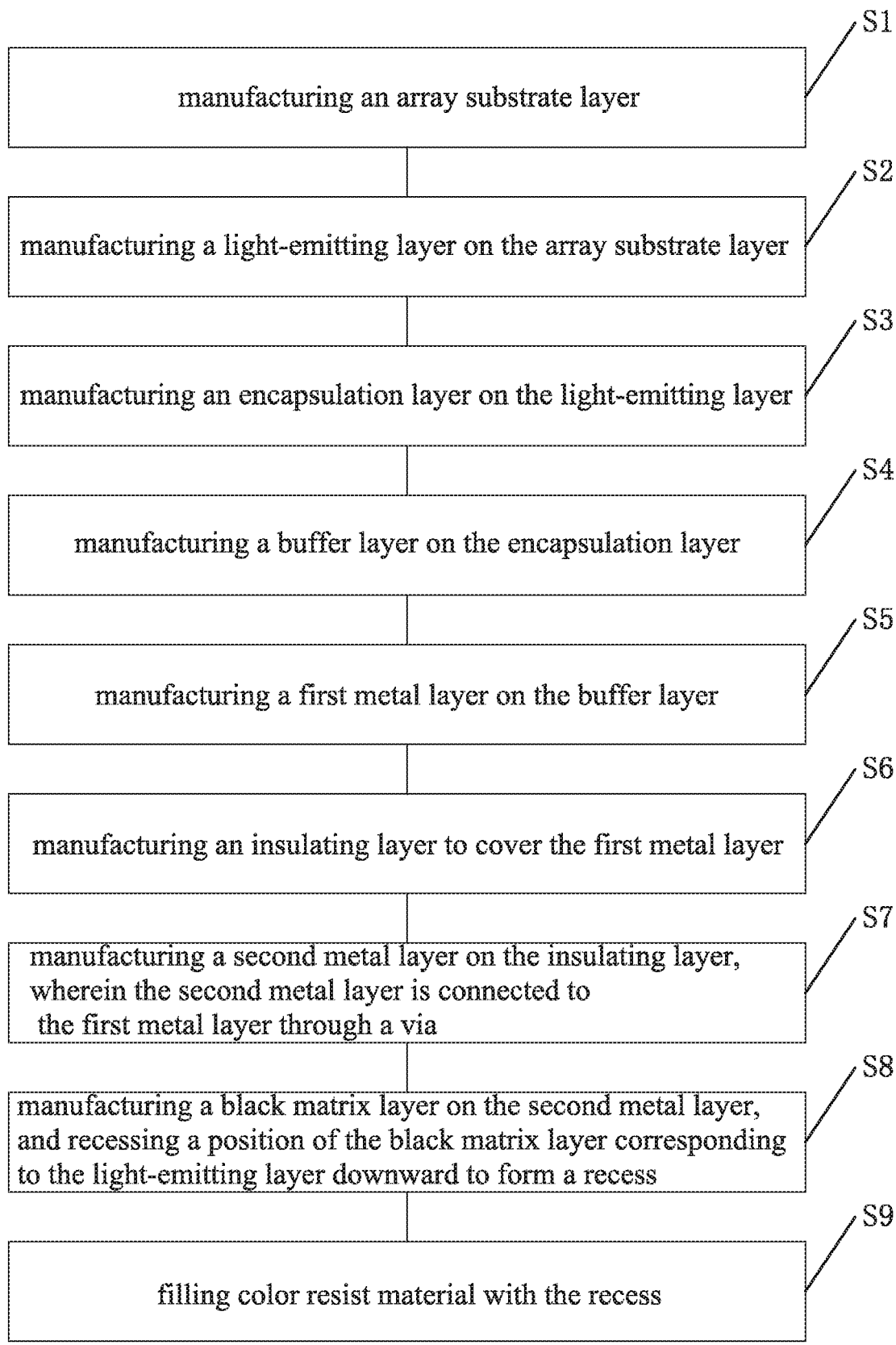
FIG. 4 is a diagram showing steps of manufacturing a display device of the present invention.

As shown in FIG. 4, a method of manufacturing the display device 100 of the present invention is further provided according to another embodiment of the present invention, comprising the following steps: a step S1 of manufacturing the array substrate layer 1; a step S2 of manufacturing the light-emitting layer 4 on the array substrate layer 1; a step S3 of manufacturing the encapsulation layer 6 on the light-emitting layer 4; a step S4 of manufacturing the buffer layer 7 on the encapsulation layer 6; a step S5 of manufacturing the first metal layer 8 on the buffer layer 7; a step S6 of manufacturing the insulating layer 9 to cover the first metal layer 8; a step S7 of manufacturing the second metal layer 10 on the insulating layer 9, wherein the second metal layer 10 is connected to the first metal layer 8 through the via; a step S8 of manufacturing the black matrix layer 11 on the second metal layer 10, and recessing the position of the black matrix layer corresponding to the light-emitting layer 4 downward to form the recess 13 by a exposure, development, and baking process; and a step S9 of filling the color resist material with the recess 13.

In the step S8, the recess 13 can be obtained by etching the black matrix layer 11 and the second metal layer 10.

In the step S8, the recess 13 can also be obtained by etching the black matrix layer 11, the second metal layer 10, and the insulating layer 9.

In the step S8, the recess 13 can further be obtained by etching the black matrix layer 11, the second metal layer 10, the insulating layer 9, and the buffer layer 7.

The display device 100 is manufactured by the aforementioned method. First, the black matrix layer 11 is directly disposed on a second metal layer 10 in such a manner that a distance between the black matrix layer 11 and the light-emitting layer 4 is shorten to avoid light loss, and thus transmittance is improved. Secondly, the black matrix layer 11 can shield the second metal layer 10 to avoid affecting the customer experience caused by high reflectivity of the second metal layer 11. The black matrix layer 11 is directly disposed on the second metal layer 10 as the photoresist mask used in the etching process at the second metal layer 10 to form the recess 13 filled with color resist material.

Thus, an exposure process and a lift-off process can be omitted while low reflectivity and high transmittance of the display device are ensured so as to reduce production costs.

The display device and the manufacturing method making the same provided by the present invention are described in detail above. It should be understood that the exemplary embodiments described herein are to be considered as illustrative only to help understand the method of the present invention and core ideas thereof, and are not intended to limit the present invention. Descriptions of features or aspects in each exemplary embodiment should generally be deemed the similar features or aspects suitable for other exemplary embodiments. Although the present invention has been described with reference to the exemplary embodiments, various changes and modifications can be made by those skilled in the art. The present invention is intended to cover such changes and modifications within the scope of the appended claims, and any modifications, equivalent alternatives, and changes within the spirit and scope of the present invention are intended to be included within the scope of the present invention.

What is claimed is:

1. A display device comprising:
an array substrate layer;
a light-emitting layer disposed on the array substrate layer;
an encapsulation layer disposed on the light-emitting layer;
a buffer layer disposed on the encapsulation layer;
a first metal layer disposed on the buffer layer;
an insulating layer covering the first metal layer;
a second metal layer disposed on the insulating layer, wherein the second metal layer is connected to the first metal layer through a via; and
a black matrix layer covering the second metal layer;
wherein an area of the black matrix layer corresponding to the light-emitting layer is recessed downward to form a recess, the recess is filled with color resist material, and the area is recessed from a surface of a side of the black matrix layer facing away from the array substrate layer into the buffer layer to form the recess.

2. The display device of claim 1, wherein the area is recessed from a surface of a side of the black matrix layer facing away from the array substrate layer to a surface of a side of the second metal layer facing the array substrate layer to form the recess.

3. The display device of claim 1, wherein the area is recessed from a surface of a side of the black matrix layer facing away from the array substrate layer into the insulating layer to form the recess.

4. The display device of claim 1, further comprising:
a plurality of anodes spaced apart from each other on the array substrate layer, wherein the light emitting layer is disposed on the plurality of anodes;
a pixel defining layer disposed on the array substrate layer between two of the anodes adjacent to each other; and
a cathode disposed on the light-emitting layer.

5. The display device of claim 1, further comprising a planar layer disposed on the black matrix layer.

6. A method of manufacturing the display device claimed in claim 1, comprising steps of:
a step S1 of manufacturing the array substrate layer;
a step S2 of manufacturing the light-emitting layer on the array substrate layer;
a step S3 of manufacturing the encapsulation layer on the light-emitting layer;
a step S4 of manufacturing the buffer layer on the encapsulation layer;
a step S5 of manufacturing the first metal layer on the buffer layer;
a step S6 of manufacturing the insulating layer to cover the first metal layer;
a step S7 of manufacturing the second metal layer on the insulating layer, wherein the second metal layer is connected to the first metal layer through the via;
a step S8 of manufacturing the black matrix layer on the second metal layer, and recessing the position of the black matrix layer corresponding to the light-emitting layer downward to form the recess; and
a step S9 of filling the color resist material with the recess.

7. The method of manufacturing the display device of claim 6, wherein in the step S8, the recess is obtained by etching the black matrix layer and the second metal layer.

8. The method of manufacturing the display device of claim 6, wherein in the step S8, the recess is obtained by etching the black matrix layer, the second metal layer, and the insulating layer.

9. The method of manufacturing the display device of claim 6, wherein in the step S8, the recess is obtained by etching the black matrix layer, the second metal layer, the insulating layer, and the buffer layer.

* * * * *